(12) United States Patent
Fan et al.

(10) Patent No.: US 7,102,200 B2
(45) Date of Patent: Sep. 5, 2006

(54) ON-DIE TERMINATION RESISTOR WITH ANALOG COMPENSATION

(75) Inventors: Yongping Fan, Portland, OR (US); Jeffrey E Smith, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 593 days.

(21) Appl. No.: 09/944,222

(22) Filed: Sep. 4, 2001

(65) Prior Publication Data

US 2003/0042573 A1   Mar. 6, 2003

(51) Int. Cl.
*H01L 27/06* (2006.01)
*H03K 17/16* (2006.01)

(52) U.S. Cl. .............. 257/379; 257/E27.016; 326/30

(58) Field of Classification Search .......... 257/350, 257/363, 379, 380, E27.033; 326/30, 83
See application file for complete search history.

(56) References Cited

U.S. PATENT DOCUMENTS

| | | | |
|---|---|---|---|
| 5,329,190 A * | 7/1994 | Igarashi et al. ........... 327/309 |
| 5,680,060 A * | 10/1997 | Banniza et al. ............ 326/30 |
| 5,821,768 A * | 10/1998 | Rau ............................. 326/31 |
| 6,351,138 B1 * | 2/2002 | Wong .......................... 326/30 |
| 6,362,655 B1 * | 3/2002 | Abraham et al. ........... 326/83 |
| 6,388,495 B1 * | 5/2002 | Roy et al. .................. 327/309 |
| 6,424,169 B1 * | 7/2002 | Partow et al. ............... 326/30 |
| 6,429,685 B1 * | 8/2002 | Stockstad .................... 326/83 |
| 6,525,558 B1 * | 2/2003 | Kim et al. .................. 326/30 |
| 6,560,290 B1 * | 5/2003 | Ahn et al. ................. 375/259 |

OTHER PUBLICATIONS

Jed Griffin and David Johnson, "*Large Signal Active Resistor Output Driver*", IEEE 42$^{nd}$ Symposium on Circuits and Systems (Aug. 8-11, 1999).

Masashi Horiguchi et al., "A *Tunable CMOS-DRAM Voltage Limiter with Stabilized Feedback Amplifier*," IEEE Journal of Solid-State Circuits, vol. 25, No. 5, Oct. 1990.

* cited by examiner

*Primary Examiner*—Carl Whitehead, Jr.
*Assistant Examiner*—Jennifer M Dolan
(74) *Attorney, Agent, or Firm*—Kenyon & Kenyon LLP

(57) ABSTRACT

An on-die termination resistor includes three transistors and a resistor. The resistor keeps at least one of the transistors from entering the saturation region and therefore improves the I-V characteristics of the termination resistor.

22 Claims, 5 Drawing Sheets

US 7,102,200 B2

ON-DIE TERMINATION RESISTOR WITH ANALOG COMPENSATION

FIELD OF THE INVENTION

The present invention is directed to electrical circuits on printed circuit boards. More particularly, the present invention is directed to analog on-die termination resistors for electrical circuits on printed circuit boards.

BACKGROUND INFORMATION

Printed circuit boards ("PCBs") populated with silicon chips typically require termination resistors for terminating the transmission lines that run throughout the PCBs. Termination resistors are necessary for good signal integrity at a high frequency operation.

Termination resistors can be integrated within the silicon chips or placed directly on the PCB. Traditionally, the termination resistors are placed on the PCB board because of the difficulties in designing high quality resistors in a silicon chip. However, as electronic systems on PCBs become more and more complicated, there is a large number of input receivers/output drivers that need termination, and consequently it has becomes very difficult to place all of the termination resistors on PCB board. Therefore, the need for the termination resistors to be placed on silicon chips, as on-die termination ("ODT") resistors, has increased.

To compensate for the resistance change caused by process and temperature variations, digital compensation circuits have been used to make sure an ODT resistance is within a pre-determined range over different process corners (i.e., statistical variation process parameters) and temperature. Difficulties arise, however, because the device parameters in these circuits greatly vary with process and temperature conditions, and because the I-V characteristics of MOS transistors used in these circuits are non-linear.

To improve the linearity of an ODT resistor, a number of structures have been explored, including an all-PMOS active resistor structure disclosed in J. Griffin et al., "*Large Signal Active Resistor Output Drive*", IEEE 42$^{nd}$ Symposium on Circuits and Systems (Aug. 8–11, 1999), hereinafter "Griffin". FIG. 1 is a circuit diagram of the active ODT resistor 10 disclosed in Griffin. ODT resistor 10 includes positive-channel metal-oxide semiconductor ("PMOS") transistors 12–14. With resistor 10, the size (i.e., the channel width/channel length ratio) of transistors 12 and 13 are the same, but the size of transistor 14 must be approximately four times the size of transistors 12 and 13 to achieve linearity.

The all-PMOS ODT resistor shown in FIG. 1 has good linearity when used in digital compensation circuits where the gate bias $V_{GG}$ of transistor 12 at terminal 17 is set to $V_{SS}$. In this case, transistor 12 is in the linear region until the pad terminal voltage (or output voltage $V_o$) 16 is lower than its PMOS threshold voltage $V_t$.

However, the use of digital impedance control include the disadvantages of step-like impedance adjustments (normally 5~10%), switching noise generation from turning on/off the different legs of the ODT resistor, interference with data transmission, and the need for a state machine in order to update resistor value.

In analog impedance control, the compensation is accomplished by changing the gate bias. However, the linearity of transistor 12 of FIG. 1 deteriorates when $V_{GG}$ reaches approximately $V_{cc}/2$ at fast process corner and lower temperature. This is because transistor 12 enters the saturation region when the pad voltage is lower than $V_{cc}/2+V_t$.

Based on the foregoing, there is a need for an improved ODT resistor suitable for analog impedance control, and an analog feedback loop that provides a suitable gate bias for the ODT resistor.

DETAILED DESCRIPTION

One embodiment of the present invention is an ODT resistor that has a poly resistor and three PMOS transistors. The ODT resistor is suitable for analog impedance control because it has improved linearity over all possible gate bias over all process corners and temperatures.

Figure 1:
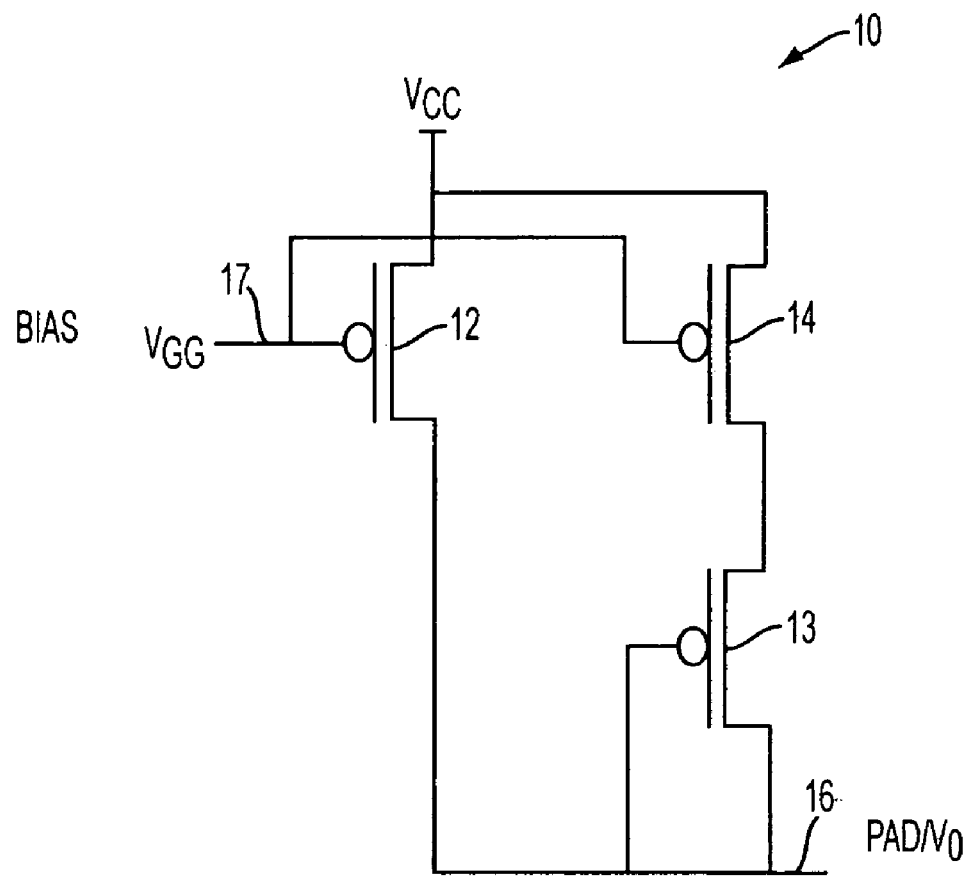
FIG. 1 is a circuit diagram of an active ODT resistor disclosed in prior art.
Figure 2:
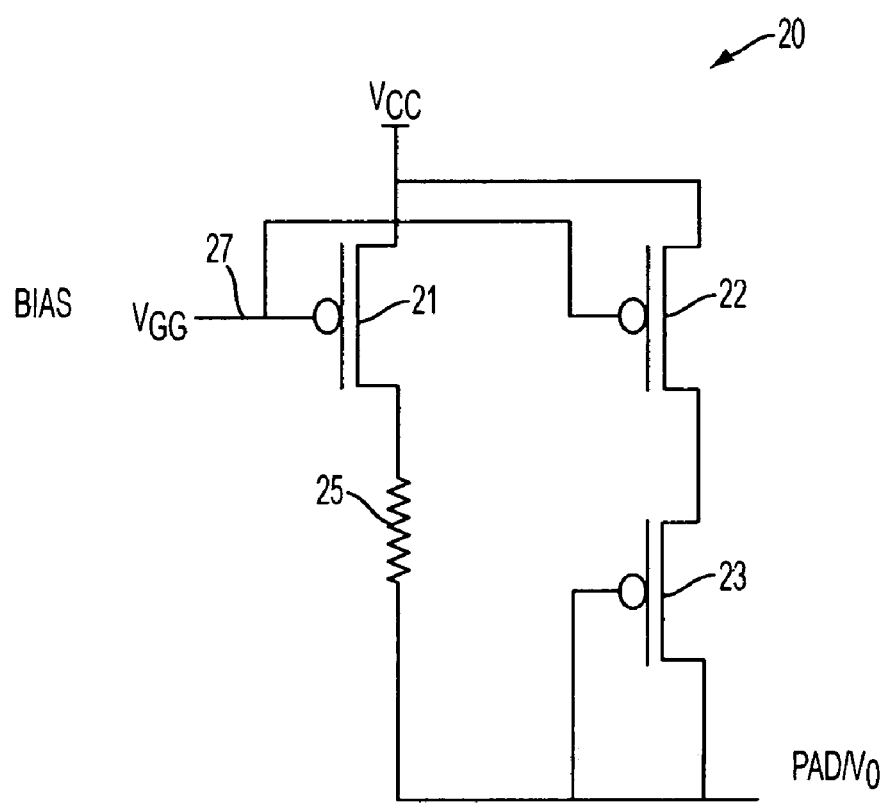
FIG. 2 is a circuit diagram of an ODT resistor in accordance with one embodiment of the present invention.

FIG. 2 is a circuit diagram of an ODT resistor 20 in accordance with one embodiment of the present invention. ODT resistor 20 is formed on a die of a semiconductor device that is placed on a PCB.

ODT resistor 20 includes three transistors 21–23 and a resistor 25. Resistor 25 is coupled to the source of transistor 21. Transistors 21–23 are PMOS transistors, with transistor 23 connected like a diode (i.e., the gate and source are coupled together). The gates of transistors 21 and 22 are coupled to a bias terminal 27. In another embodiment, negative-channel metal-oxide semiconductor ("NMOS") transistors can be used in place of PMOS transistors 21–23.

Resistor 25 is a poly resistor that keeps transistor 21 from entering into the saturation region and therefore helps to make the I-V characteristics of ODT resistor 20 more linear. In another embodiment, if the requirement for linearity is not strict, resistor 25 can be a PMOS transistor with its gate connected to ground. In other embodiments, resistor 25 may be another type of resistor such as an N_well, P diffusion or N diffusion resistor. The linearity of ODT resistor 20 is further improved by the current path formed by transistors 22 and 23. ODT resistor 20 can be turned off by applying $V_{cc}$, (a power terminal of the silicon die) to bias terminal 27. In one embodiment, bias terminal is coupled to the power supply (or ground if NMOS transistors are used) to provide stabilization.

Different resistance values can be obtained by changing the sizes of transistors 21–23 and resistor 25. In one embodiment, resistor 25 is chosen to be about 50% of the total resistance of ODT resistor 20.

In one embodiment, ODT resistor 20 provides 45 ohms of on-die termination in a 0.18 um CMOS technology. In this embodiment, resistor 25 is 23 ohms, the channel width/ channel length ratio ("W/L") for transistors 21, 22 and 23 are 210/0.28, 282/0.28 and 74/0.28 respectively.

In general, for a fixed ODT resistance, a bigger resistor 25 results in a better linearity of current-voltage characteristics. However, if resistor 25 is too big (e.g., 70% of the resistance of ODT resistor 20), the size of transistor 21 will be very big, and it is hard to compensate the resistor 25 changes (caused by process/temperature variations) by adjusting gate bias 27.

After the size of resistor 25 and transistor 21 are fixed, the size of transistors 22 and 23 may be adjusted to get the best R-V characteristics. To reduce the parasitic effect, transistor 23 should be kept as small as possible while transistor 22 can be very large.

Figure 3:
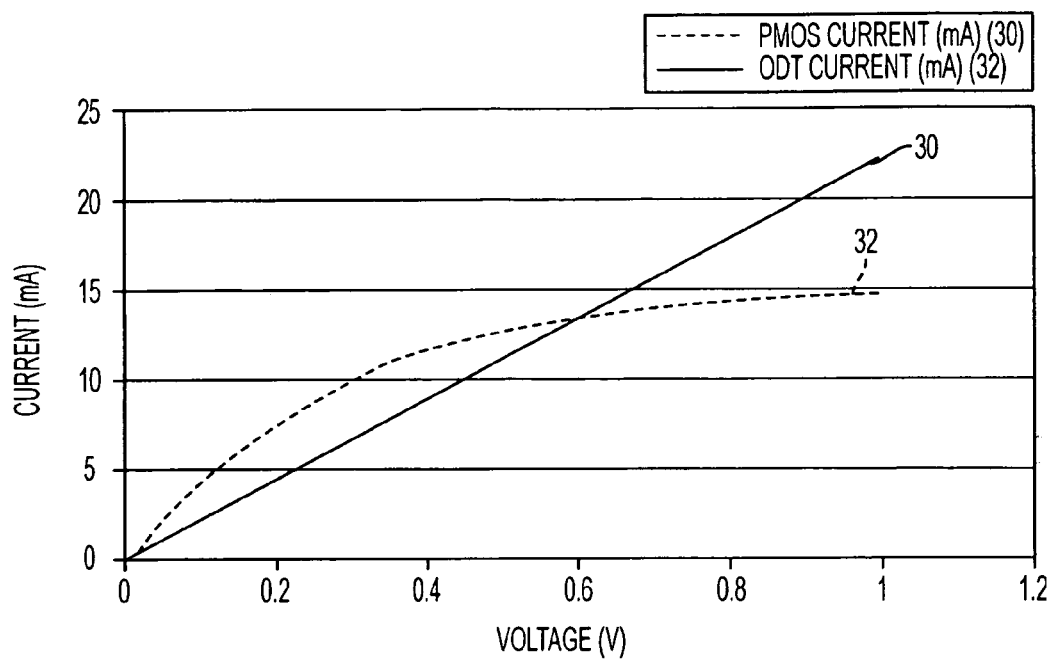
FIG. 3 is a graph illustrating the current as a function of voltage for an ODT resistor in accordance with one embodiment of the present invention in comparison with a standard PMOS transistor.

FIG. 3 is a graph illustrating the current as a function of voltage (i.e., the I-V characteristics) for ODT resistor 20 (line 30) in accordance with one embodiment of the present invention in comparison with a standard PMOS transistor (line 32). The ODT resistor of line 30 is designed to provide a resistance of 45 ohms, has a Vcc=1.2V and T=85C for a typical process corner, and has a gate bias of 0.31V. As shown in FIG. 3, ODT resistor 20 as reflected in line 30 has a near perfect current-voltage characteristic like that of an ideal resistor, while the PMOS transistor, as reflected in line 32, has entered into deep saturation.

Figure 4:
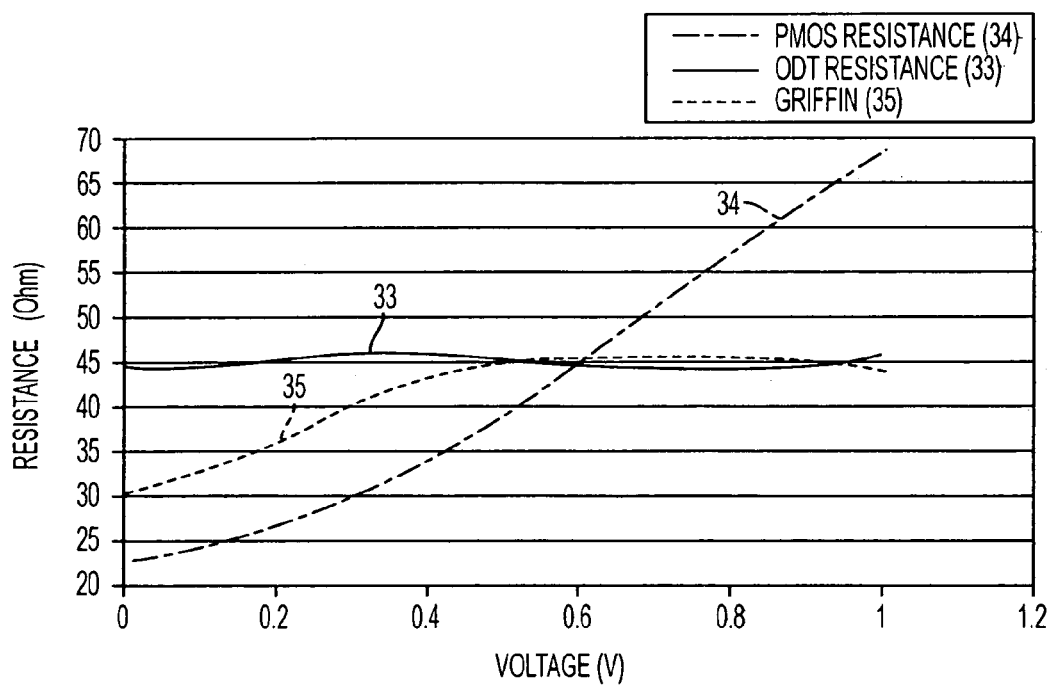
FIG. 4 is a graph illustrating large signal resistance as a function of voltage for an ODT resistor in accordance with one embodiment of the present invention in comparison with a standard PMOS transistor and a prior art ODT resistor.

FIG. 4 is a graph illustrating large signal resistance as a function of voltage (i.e., the R-V characteristics) for ODT resistor 20 (line 33) in accordance with one embodiment of the present invention in comparison with a standard PMOS transistor (line 34) and the ODT resistor disclosed in Griffin (line 35). Within the Gunning Transistor Logic ("GTL") signal swing of 1.0V, the resistance from ODT resistor 20 is from 44 to 46 ohms, while for the ODT resistor disclosed in Griffin and the standard PMOS transistor, the large signal resistance is from 30.5 to 45.5 ohms, and from 23 to 68 ohms, respectively.

Figure 5:
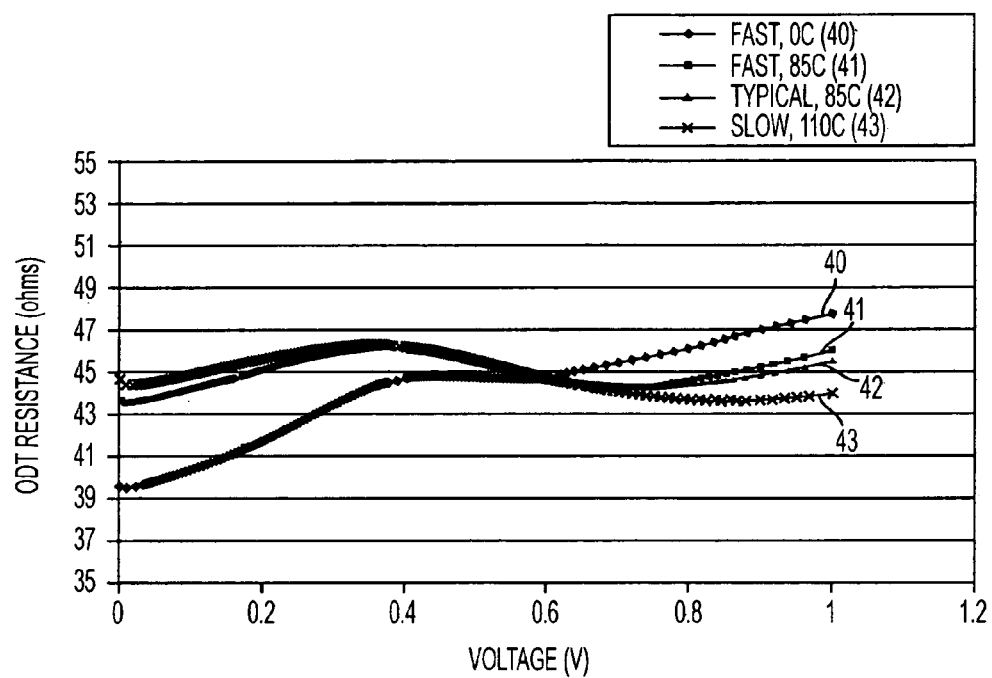
FIG. 5 is a graph illustrating the R-V characteristics for an ODT resistor at different process corners and temperature, with $V_{cc}=1.2V$.

FIG. 5 is a graph illustrating the R-V characteristics for ODT resistor 20 at different process corners and temperature, with Vcc=1.2V. Line 40 is a fast process corner at 0C, line 41 a fast corner at 85C, line 42 a typical corner at 85C, and line 43 a slow corner at 110C. It can be seen that, except for a fast corner and 0C (line 40), the ODT resistance is within 45 ohms :+/−2_ohms. The gate bias range is from 0.18V at a slow corner and 110C (line 43) to 0.47V at a fast corner and 0C (line 40).

Figure 6:
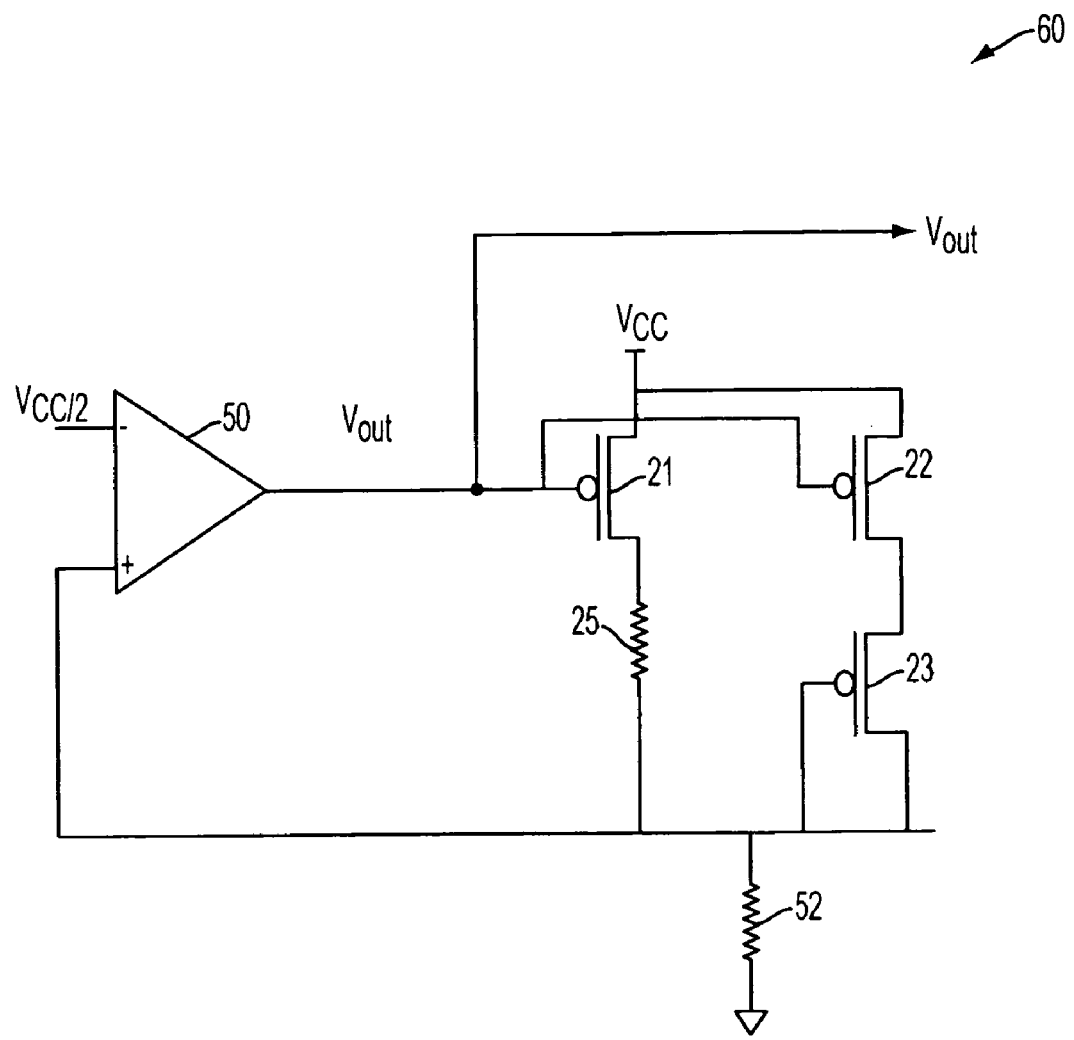
FIG. 6 is a circuit diagram of an ODT resistor circuit that includes an ODT resistor and circuitry to control its gate bias based on process and temperature conditions in accordance with one embodiment of the present invention.

FIG. 6 is a circuit diagram of an ODT resistor circuit 60 that includes an ODT resistor and circuitry to control its gate bias based on process and temperature conditions in accordance with one embodiment of the present invention. Resistor circuit 60 includes an ODT resistor that includes transistors 21–23 and resistor 25. Resistor circuit 60 further includes a high gain differential amplifier 50 and a high precision reference resistor 52 placed on the PCB board forming a feedback loop. The feedback loop constantly adjusts the bias voltage so that the ODT resistance is the same as the reference resistance. The accuracy of ODT resistance at half $V_{cc}$ (across the ODT resistor) can be expressed as a function of differential amplifier 50 gain "A" and output voltage $V_{out}$:

$$R_{ODT}/R_{ref}=[1-2(V_{out}-V_{com})/V_{cc}]/[1+2(V_{out}-V_{com})/V_{cc}] \quad (1)$$

Where $V_{com}$ is the common mode output voltage of differential amplifier 50. Since the maximum $V_{out}$ swing could be from $V_{com}$ to 0V, or from $V_{com}$ to $V_{cc}-V_t$, then for $V_{com}=V_{cc}/2$ and $V_t \ll V_{cc}$, the upper and lower limits of the ODT resistance are determined by:

$$(1-1/A)/(1+1/A) < R_{ODT}/R_{ref} < (1+1/A)/(1-1/A) \quad (2)$$

Where $R_{ref}$ is the reference resistance on the PCB board. For A=500, equation (2) results in an ODT resistance that is within 0.4% of reference resistance.

The stability of the feedback loop is an issue in the design of the ODT resistor with analog impedance control. Various frequency compensation techniques can be used to avoid the loop oscillation. In one embodiment, a minimum phase margin of 45 degrees is used for stable operations. In this embodiment, an Nwell resistor (or MOS transistor) and a Miller capacitor are used for frequency compensation. A phase margin of 60 degrees is obtained.

As disclosed, an ODT resistor with analog impedance control in accordance with one embodiment of the present invention has a resistance value that is within +/−5% across voltage swing range and process corners at operating temperature from 50C to 110C. This provides several advantages over digital impedance control. First, unlike the step-like impedance adjustments in digital control, the ODT resistor value in analog control can be continuously adjusted according to process and temperature conditions by changing the gate bias of the PMOS transistors. Second, analog impedance control does not generate noise. In contrast, with digital impedance control, the ODT resistance is adjusted by turning on and off different legs, and therefore generates spike-like noises on a power supply. Third, analog impedance control design does not interfere with data transmission and receiving. Finally, unlike with digital impedance control, a state machine is not required.

Several embodiments of the present invention are specifically illustrated and/or described herein. However, it will be appreciated that modifications and variations of the present invention are covered by the above teachings and within the purview of the appended claims without departing from the spirit and intended scope of the invention.

What is claimed is:

1. A termination resistor comprising:
   a first transistor, a second transistor, and a third transistor, all three transistors being either positive-channel metal-oxide semiconductor transistors or negative-channel metal-oxide semiconductor transistors, each transistor having a gate terminal, a first terminal, and a second terminal; and
   a first resistor having first and second terminals, the first terminal of the first resistor being directly connected to the gate terminal and the first terminal of the third transistor, the gate terminal and the first terminal of the third transistor being directly connected together, and the second terminal of the first resistor being directly connected to the first terminal of the first transistor,
   wherein the first terminal of the second transistor is directly connected to the second terminal of the third transistor,
   the second terminal of the first transistor is directly connected to the second terminal of the second transistor, and
   the gate terminal of the first transistor is directly connected to the gate terminal of the second transistor.

2. The termination resistor of claim 1, wherein said three transistors comprise positive-channel metal-oxide semiconductor transistors.

3. The termination resistor of claim 1, wherein said three transistors comprise negative-channel metal-oxide semiconductor transistors.

4. The termination resistor of claim 1, wherein said first resistor comprises a poly resistor.

5. The termination resistor of claim 1, wherein said first resistor comprises a positive-channel metal-oxide semiconductor transistor.

6. The termination resistor of claim 5, further comprising a power terminal to be coupled to a power supply voltage and a ground terminal to be coupled to ground, wherein the second terminal of the first transistor and the second terminal of the second transistor are coupled to the power terminal, and a gate terminal of the positive-channel metal-oxide semiconductor transistor arranged as the first resistor is coupled to the ground terminal.

7. The termination resistor of claim 1, further comprising a differential amplifier having an output directly connected to the gate terminal of said first transistor and the gate terminal of said second transistor, and having a first input directly connected to the first terminal of the first resistor and the first terminal and gate terminal of said third transistor.

8. The termination resistor of claim 7, further comprising an output terminal to provide output from the termination resistor, said output of the differential amplifier being coupled to the output terminal.

9. The termination resistor of claim 7, further comprising a ground terminal to be coupled to ground and a second resistor having first and second terminals, a first terminal of the second resistor directly connected to the ground terminal and the second terminal of the second resistor directly connected the first input of the differential amplifier, the first terminal of the first resistor, and the first terminal and gate terminal of said third transistor.

10. The termination resistor of claim 9, further comprising an output terminal to provide output from the termination resistor, said output of the differential amplifier being coupled to the output terminal.

11. The termination resistor of claim 10, wherein a total resistance of the termination resistor $R_{ODT}$ satisfies:

$$(1-1/A)/(1+1/A) < R_{ODT}/R_{ref} < (1+1/A)/(1-1/A)$$

where $R_{ref}$ is a resistance of said second resistor and "A" is a gain of the differential amplifier.

12. The termination resistor of claim 11, wherein a resistance of said first resistor is about 50% of the total resistance of the termination resistor.

13. The termination resistor of claim 11, further comprising a power terminal to be coupled to a power supply voltage, wherein the second terminal of the first transistor and the second terminal of the second transistor are coupled to the power terminal, and wherein a second input of said differential amplifier is arranged to receive ½ of the power supply voltage.

14. The termination resistor of claim 1 arranged in a semiconductor device, the semiconductor device further comprising a semiconductor die.

15. The termination resistor of claim 1, integrated on a semiconductor die having power and pad terminals, wherein:

the second terminal of the first transistor and the second terminal of the second transistor are coupled to the power terminal of the semiconductor die; and the first terminal of the first resistor and the gate terminal and first terminal of the third transistor are coupled to the pad terminal of the semiconductor die.

16. The termination resistor of claim 1, wherein a resistance of said first resistor is to prevent the first transistor from entering into saturation.

17. The termination resistor of claim 1, further comprising a bias terminal to be coupled to a bias voltage, a power terminal to be coupled to a power supply voltage, and an output terminal to provide output from the termination resistor, wherein:

the gate terminal of the first transistor and the gate terminal of the second transistor are coupled to the bias terminal;

the second terminal of the first transistor and the second terminal of the second transistor are coupled to the power lead, and the first terminal of the first resistor and the gate terminal and first terminal of the third transistor are coupled to the output lead.

18. The termination resistor of claim 17, wherein, if measured via the output lead, the termination resistor has a linear voltage-current characteristic for output voltages at the output lead below a threshold voltage $V_t$ of the first transistor.

19. The termination resistor of claim 1, wherein a width/length channel ratio of the second transistor is larger than a width/length channel ratio of the third transistor.

20. The termination resistor of claim 19, wherein a width/length channel ratio of the second transistor is larger than a width/length channel ratio first transistor, and the width/length channel ratio of the first transistor is larger than a width/length channel ratio of the third transistor.

21. The termination resistor of claim 1, wherein a resistance of said first resistor is about 50% of a total resistance of the termination resistor.

22. A termination resistor comprising:

a first transistor;

a second transistor having a gate coupled to a gate of said first transistor, and having a drain coupled to a drain of said first transistor;

a third transistor having a drain coupled to a source of said second transistor; and a first resistor coupled between a source of said first transistor, and a gate and source of said third transistor, wherein a resistance of said first resistor is about 50% of a total resistance of the termination resistor.

* * * * *

UNITED STATES PATENT AND TRADEMARK OFFICE
CERTIFICATE OF CORRECTION

PATENT NO. : 7,102,200 B2  
APPLICATION NO. : 09/944222  
DATED : September 5, 2006  
INVENTOR(S) : Yongping Fan et al.

Page 1 of 1

It is certified that error appears in the above-identified patent and that said Letters Patent is hereby corrected as shown below:

| Column | Line | |
|---|---|---|
| 5 | 27 | After "connected" insert --to--. |
| 6 | 36 | Before "first transistor" insert --of the--. |

Signed and Sealed this

Twenty-seventh Day of March, 2007

JON W. DUDAS  
*Director of the United States Patent and Trademark Office*